United States Patent [19]
Rowlette, Sr.

[11] Patent Number: 5,074,799
[45] Date of Patent: Dec. 24, 1991

[54] GEL CONNECTOR OF LAMINAR CONSTRUCTION

[75] Inventor: John R. Rowlette, Sr., Clemmons, N.C.

[73] Assignee: AMP Incorporated, Harrisburg, Pa.

[21] Appl. No.: 675,790

[22] Filed: Mar. 27, 1991

[51] Int. Cl.[5] .............................................. H01R 9/09
[52] U.S. Cl. ..................................... 439/91; 439/178
[58] Field of Search ...................... 439/66, 74, 75, 86, 439/91, 178, 179, 876

[56] References Cited

U.S. PATENT DOCUMENTS

| | | | |
|---|---|---|---|
| 4,008,300 | 2/1977 | Penn | 439/91 |
| 4,770,641 | 9/1988 | Rowlette | 439/86 |
| 4,814,040 | 3/1989 | Ozawa | 439/91 |
| 4,891,013 | 1/1990 | Komaki | 439/66 |
| 4,927,368 | 5/1990 | Shino | 439/91 |
| 5,006,286 | 4/1991 | Dery et al. | 439/178 |
| 5,007,842 | 4/1991 | Deak et al. | 439/66 |

Primary Examiner—Neil Abrams

[57] ABSTRACT

An electrical connector (30) for interconnecting the contacts (22) of a component (18) to the contacts (14) of a circuit (12) includes a planar laminate of insulating sheets (38, 42) and a layer of insulating gel (46) having holes (40, 44) extending through the sheets and the gel (46) with a conductive gel (48) in said holes of a volume to be compressed to flow axially to interconnect the component and circuit contacts.

10 Claims, 4 Drawing Sheets

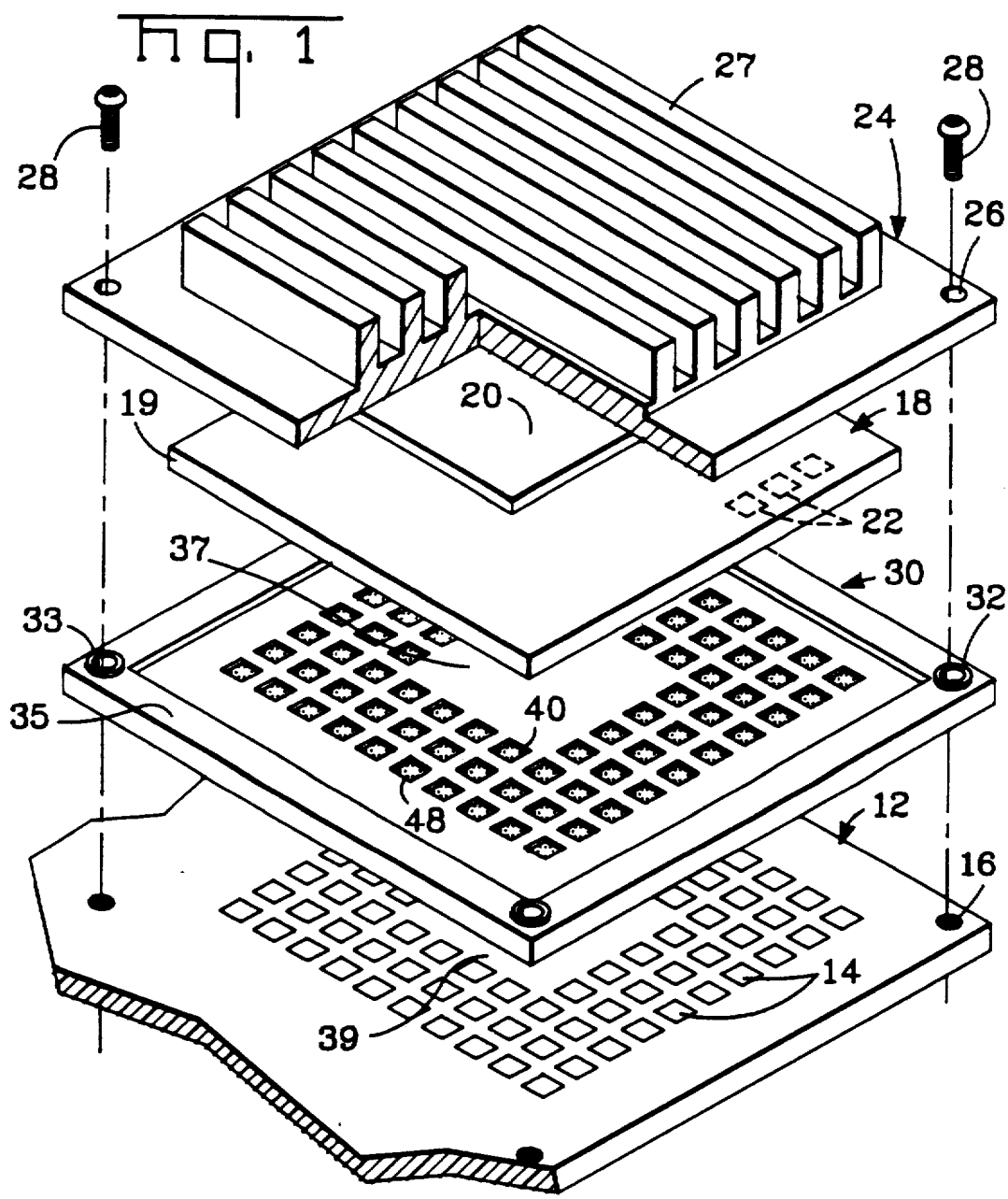

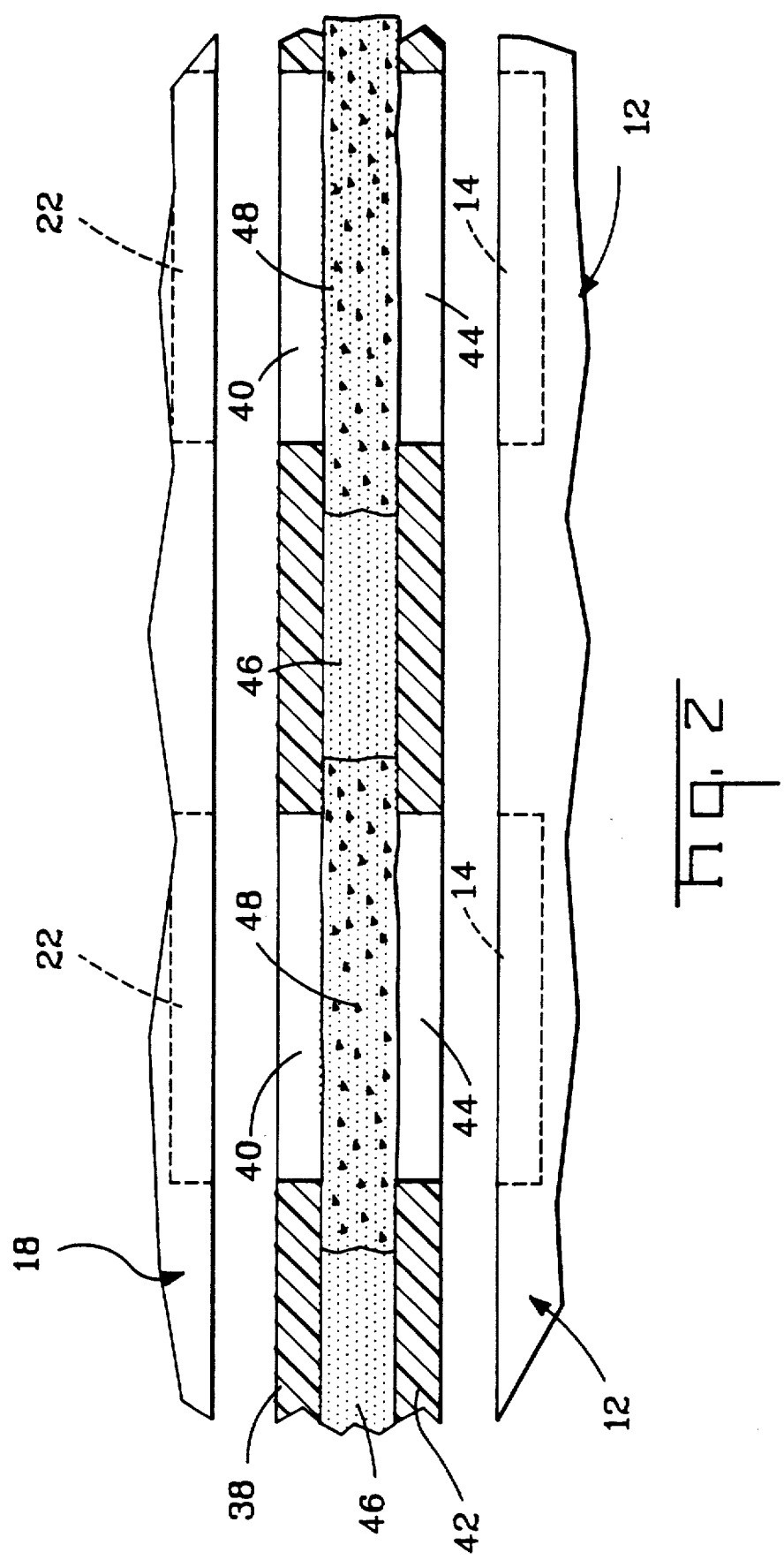

GEL CONNECTOR OF LAMINAR CONSTRUCTION

This invention relates to an electrical connector of a laminar construction operable to interconnect arrays of component contacts to contacts of a printed circuit board and the like through the hydraulic action of non-conductive and conductive gels or highly compliant conductive material having gel-like characteristics.

This invention is related to U.S. patent application Ser. No. 07/613,195 filed Nov. 15, 1990 and directed to a conductive gel area array connector.

BACKGROUND OF THE INVENTION

With many electronic integrated circuit devices and components such as the Land Grid Array (LGA) device used for computers and other apparatus, the numbers of contacts are relatively high. Moreover, the contacts are located in a planar array of high density, with the contacts frequently on centers as close as 0.050 inches. In traditional electronic interconnection practice, the normal forces required for providing a stable, low-resistance interface have been on the order of 100 grams for gold plated contacts and 300 grams for tin plated contacts, with a rather wide variation in normal forces dependent upon the environment of use. These requirements, when carried out with respect to as many as 100 or 200 contacts necessarily made simultaneously, entail overall closure forces ranging between 20 and 130 pounds to create considerable loads for the packages handling such components, particularly when viewed in the context of the very small and relatively fine plastic and metal structures involved.

In the aforementioned U.S. patent application related to a conductive gel area array connector and particularly in the disclosures therein, a type of conductive gel is employed wherein the forces of displacement of contacts into the gel or of the gel to flow into contact with the contacts are quite small, on the order of 20 grams per contact, including the normal force of the gel and the supporting plastic structure for the gel. This provides closure forces for gold-type contact systems on the order of 10 pounds or less, thus relieving the mechanical stresses involved in packages adapted to accommodate components such as LGA integrated circuits. With respect to the foregoing improvement, it was found that the surrounding and supporting plastic structure for the conductive gels was indeed the principal force generating structure, the gel itself having a normal force requirement much less than 15 grams.

A second aspect and problem relating to the aforementioned gel connector relates to the difficulty of handling gels in very small quantities in terms of controlling volumes of the gels and injecting such volumes into supporting structures.

The present invention has an objective of providing a gel connector of laminar construction requiring a very low force of engagement for interconnection as particularly related to area array electronic components such as LGA devices. It has as a further object the provision of an electrical connector utilizing conductive gels in conjunction with non-conductive gels to achieve a hydraulic interconnection of low force. It is yet a further object to provide a gel-type area array connector which is readily manufacturable by existing transfer processes.

SUMMARY OF THE INVENTION

The foregoing objects are achieved by the invention through the provision of a package of planar and laminar construction which is fitted between a component such as a LGA ceramic integrated circuit device containing arrays of contacts on close centers to corresponding contacts on similar centers in a circuit such as a circuit board with fasteners provided to clamp the component to the invention array connector and effect an interconnection between such contacts. The package of the invention includes sheets of relatively firm insulting film perforated to form holes in patterns aligned with the patterns of contacts in the component and board, the sheets of film being held by a frame around the edges thereof and spaced apart by a volume of highly compliant insulating material such as an insulating gel. A conductive gel is located proximate to the holes in the films or sheets of material with the volumes of the holes and conductive and non-conductive gels made to effect a hydraulic action upon compression of the package between component and board to cause the non-conductive gel to flow in a radial sense to drive the conductive gel in an axial sense to a point of interconnecting the contacts of component and board in a broad area contact. This hydraulic action has been discovered as an extremely low-force technique of effecting large numbers of interconnections simultaneously and reliably. It has been further discovered that the basic characteristics of the gel in terms of flowing and response to the application of hydraulic force and in restoring itself upon removal of such force form is a simple and reliable way of making and unmaking electrical connections. It has been further discovered that the deposition of the gels utilizing the conductive and non-conductive gels deposited on a film through traditional coating and transfer techniques such as silk screening allows for a low cost fabrication which is both precise and practical.

IN THE DRAWINGS

FIG. 1 is a perspective view showing elements, including the package of the invention exploded to include in partial section, a circuit board, the invention package, an LGA component, and a heat sink, along with fasteners aligned with such elements;

FIG. 2 is an elevational and sectional view, substantially enlarged, of a portion of the component and board with contacts and the laminar package of the invention, prior to actuation and compression;

FIG. 3 is a view of the structure shown in FIG. 2 following actuation by compression.

DETAILED DESCRIPTION OF THE INVENTION

Figure 7:
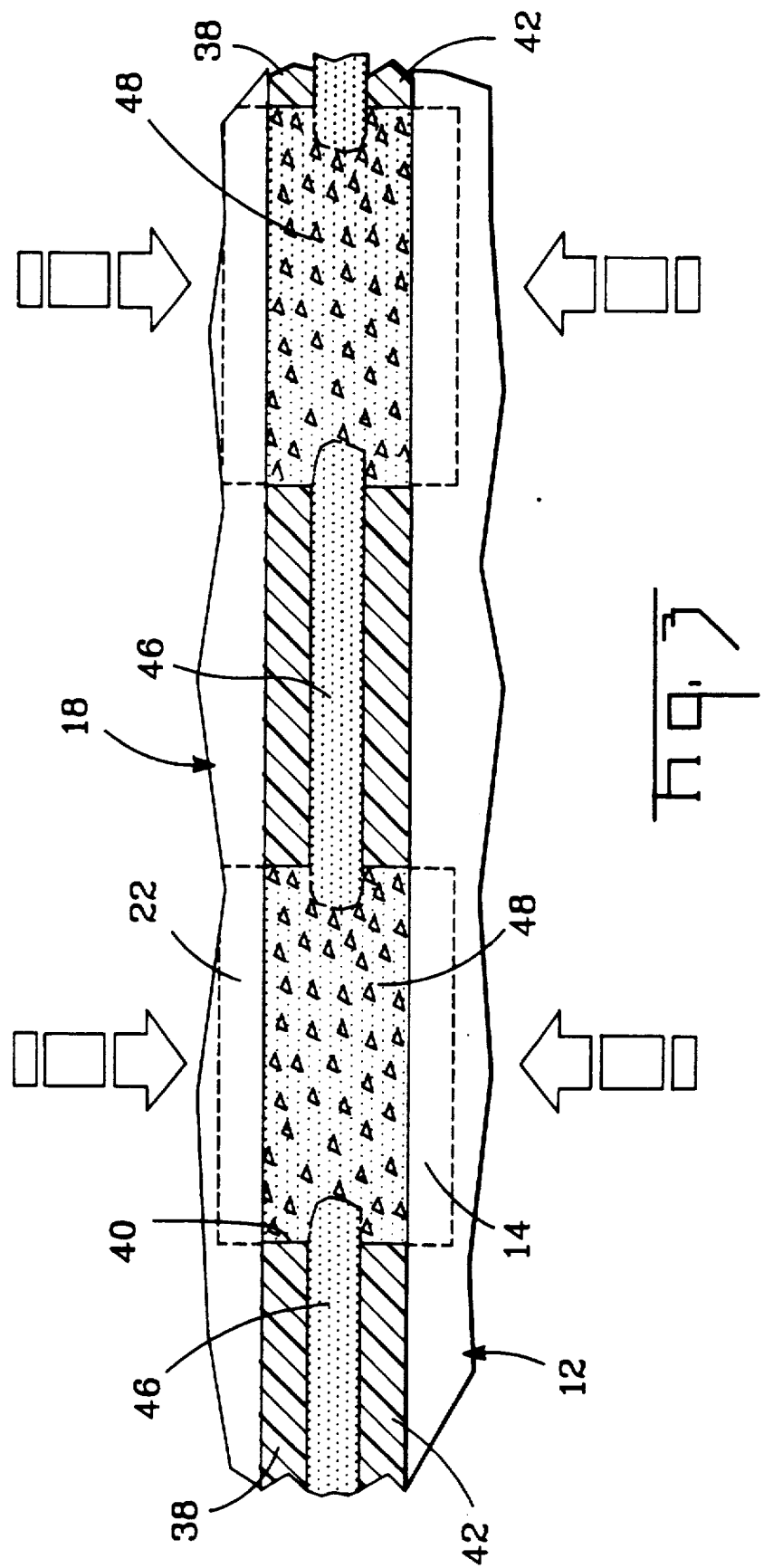

Referring now to FIG. 1, a circuit board 12, typically a multi-layer printed circuit board, includes an array of contacts 14 located on the upper surface thereof, which interconnect internally of the board to circuit traces which interconnect with various other components, the assembly of components forming a system function as for a computer, business machine, communication apparatus or the like. Board 12 includes a series of apertures 16 surrounding the array of contacts 14 that are utilized to mount components. An electronic component 18, typifying the widely used area grid array heretofore discussed as a LGA device includes a ceramic body having on the upper surface thereof a flat metal sheet element 20 which serves as a heat sink and on the lower surface thereof, an array of contact pads 22 which are, in pattern and position, complementary to the array of contacts 14 on board 12. The pads 22 connect internally of the body 19 to functioning memory and logic devices typically contained in a large scale integrated circuit. Optionally included and shown above component 18 is a heat sink 24 apertured at 26 to receive fasteners 28 at the corners thereof and typically of a metallic construction of high thermal conductivity and including a series of fins 27 adapted to conduct heat and provide a broad area for heat dissipation. The heat sink 24 includes a lower surface which is flat and adapted to engage the broad area of contact of the heat sink 20 of component 18 and hold and clamp the component downwardly as driven by the fasteners 28 positioned through the apertures 26 and through the apertures 16 into and beneath the board 12 to be engaged by fasteners such as nuts (not shown) to draw the heat sink down and drive the component 18 downwardly.

Located between component 18 and board 12 is the connector array 30 of the invention including eyelets 32 at the corners thereof and apertured at 33 to receive fasteners 28 passed therethrough, which position and align the connector array package 30 relative to component 18 and board 12, and more particularly, relative to the contacts 14 and 22 thereof. The connector array 30 includes a blank center portion 37 which corresponds with a blank center portion 39 on board 12 and a similar blank portion on the component 18; center portion 37 is surrounded by an array of contacts 48, each corresponding in area and in position to the contact pads 22 and contacts 14.

Figure 4:
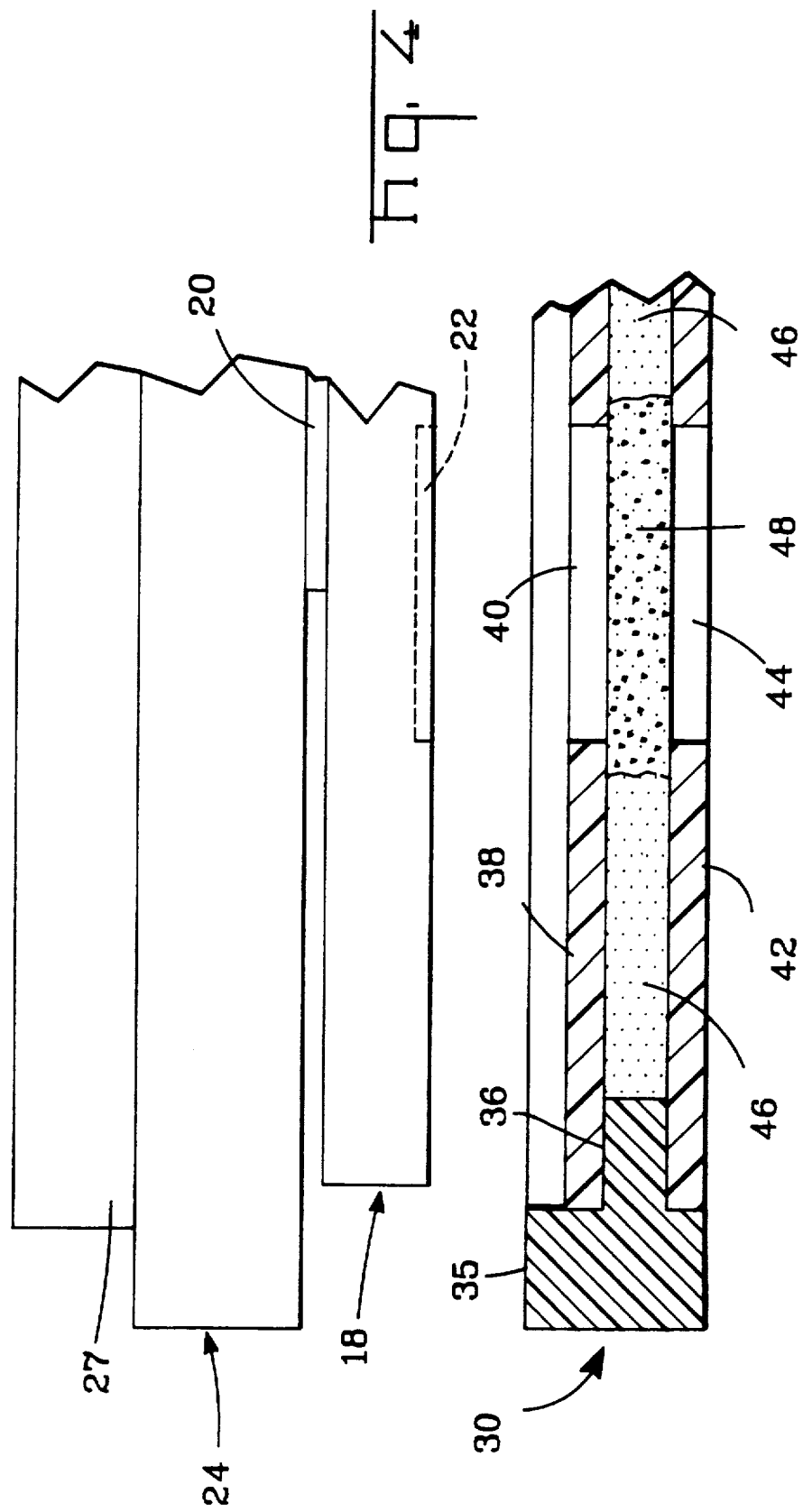
FIG. 4 is a elevational view in section taken along lines 4—4 in FIG. 1.

The package 30 is comprised of a frame 35, which can be seen in FIG. 4 in cross-section to include a top and bottom relief as at 36 to receive the edges of sheets 38 and 42 that may be suitably attached to the frame 35 as by adhesive or other means and are aligned and positioned by such frame 35 as part of the connector array package 30. The frame 35 further has a controlled thickness to limit compression of the package 30 under force of the heat sink 24 as it drives the component 18 downwardly by manipulation of fasteners 28. The sheets 38.42 may be formed of plastic film material which, in one embodiment, is on the order of 0.003 inches in thickness of a type characterized as a polyamide. The sheets 38 and 42 are perforated as by a punch and die to form holes 40 and 44 therein which, in position, complement the contacts 14 and pads 22 of the board and component respectively. This may be better seen in FIGS. 2 and 3 which show the contacts and pads aligned with the holes 40 and 44.

As can be discerned in these figures, the sheets 38 and 42 are spaced apart, at the edges by frame 35 and interiorly of such frame by a medium in the form of a gel 46. The gel 46 is a highly compliant gel or gel-like substance which essentially fills the volume extending between the interior of the sheets 38 and 42 except for the region proximate the holes 40 and 44. As is explained in the earlier mentioned U.S. patent application 07/613,195, a gel has a characteristic when driven or with pressure applied, to flow easily and readily, almost liquid-like, but return to its original geometry and restore itself, upon removal of the pressure or driving force. In the aforementioned application, the gel described was a conductive gel formed of an insulating gel loaded with conductive particles to an extent to effect a percolating conduction of current therethrough upon engagement of electrically conducting contact surfaces. The gel 46 in the present package is a non-conductive or insulating gel. Centered in and proximate to the holes 40 and 44 is a conductive gel 48, which in practice extends slightly beyond the edge surfaces of the holes 40,44 in the manner shown in FIGS. 2 and 4, when in the noncompressed or in undriven condition. In a practical prototype embodiment, the thickness of gels 46 and 48, corresponding to the spacing between sheets 38 and 42 was on the order of 0.005 inches.

In accordance with the invention, the volumes of space between sheets 38 and 42 and the corresponding volume of gel 46, taken in conjunction with the volume of gel 48, is adjusted so that upon compression of gel 46 through compression of the sheets 38 and 42, gel 46 will be driven radially inwardly as indicated in FIG. 3. This will, in turn, drive the gel 48 axially upwardly and downwardly to effect a contact between the pads 14 and contact pads 22 to effect an interconnection between the component 18 and board 12. In context of the prototype thus far described, the holes 40 and 44 were on the order of 0.025 inches in diameter. As heretofore mentioned, due in large part to the characteristics of gel material, moving the component 18 and board 12 apart will result in the gel 48 returning to the condition shown in FIG. 2 from the condition shown in FIG. 3, effectively disconnecting the component 18 from the board 12.

As heretofore mentioned, the invention contemplates a hydraulic action effecting a displacement of the non-conductive and conductive gels. The invention contemplates that these gel mediums represent highly compliant materials having characteristics such that, upon the application of force or pressure, the materials are easily displaced, and upon release of such pressure, the materials return to their original physical geometry. While gels are preferred, particularly for applications wherein the contact array is large and the forces of closure become a barrier to traditional interconnection, the invention further contemplates the use of other materials having gel-like characteristics for either or both of the mediums 46 and 48. Thus, in an embodiment utilizing a closed cell foam, the material 48 may be substituted by such foam material with the material 46 remaining a conductive gel. It is also contemplated that the material 48 may be constituted of a conductive elastomer as long as such elastomer has a compliance permitting the hydraulic action heretofore described. Such alternatives would be used in connection with individual interconnects or low count multiple contacts where the particular characteristics in terms of conductivity are relative to that of a gel are needed.

In accordance with the invention concept in terms of manufacture, the sheets 38 and 42 may be formed by punching to define the holes therein with one of the sheets, such as sheet 42, being coated with the gel 46 as by a transfer coating and/or silk screening of the gel into the areas on top of sheet 42 surrounding the holes 44. Thereafter, the conductive gel 48 which, in practice, forms a series of spaced apart spots may be deposited onto sheet 38 as by a transfer process, silk screening or the like, with the frame 35 added and sheet 38 applied over the coated sheet 42. The invention also contemplates other geometric configurations where a non-conductive gel is driven by element to flow hydraulically and drive a conductive gel to flow and interconnect contacts.

Having now described the invention in terms intended to enable a practice thereof in preferred modes, the following claims are appended to define what is believed to be inventive.

I claim:

1. An electrical connector for interconnecting corresponding first and second contacts spaced apart by a given distance including:
   first and second means having axially aligned apertures;
   third means having apertures axially aligned with the apertures of the first and second means and being disposed between said first and second means, the said first and second means being of an insulating material that is relatively firm and the third means being of an insulating material that is highly compliant;
   a fourth means comprised of a conducting material that is highly compliant located within the apertures of the third means; and
   mounting means operable to drive the first and second means axially together to cause the said third means to flow radially and drive the said fourth means to flow axially said given distance and interconnect the corresponding said first and second contacts.

2. The connector of claim 1 wherein the said first contacts are carried by a component body in a patterned array and the said second contacts are carried by a circuit board in similar array with the said first, second, and third means being formed in a similar pattern, said mounting means positioning said first, second, and third means between said first and second contacts and operable to drive the said component body to compress said first, second, third, and fourth means and cause flow of said fourth means to effect said interconnection.

3. The connector of claim 2 wherein the said first and second means are comprised of sheets of insulating material having apertures therein corresponding to the said patterned array of contacts and the said third and fourth means are disposed between said sheets of material with the fourth means centered on the said apertures.

4. The connector of claim 3 wherein the said third and fourth means are comprised of gel material.

5. The connector of claim 4 further including frame means carrying the said sheets of material and the said gel materials therewithin.

6. The connector of claim 5 wherein the said frame means has a thickness to limit compression of the said sheets of material and fix the distance of axial flow of the said gel material.

7. An electrical connector for interconnecting arrays of contacts of components to corresponding arrays of contacts of circuits including:
   a housing adapted to hold a component with the contacts thereof aligned with the contacts of the circuit;
   a planar array of contacts fitted in said housing between said arrays of contacts of the component in circuit, the said planar array being comprised of a pair of sheets of insulating material spaced apart by an insulating gel, said sheets further including apertures extending axially therethrough and said insulating gel aligned with the contacts of the said component and the said circuit;
   a conductive gel located in the apertures in alignment with the contacts of the component and circuit and nominally spaced therefrom by the thickness of said sheets; and
   means operable to engage the said component and drive said component against said planar array to compress said sheets and said gels to cause the insulating gel to flow radially and hydraulically drive the conductive gel to flow axially to interconnect the contacts of the said component and circuit, the said means being further operable to release said sheets and said gels from compression to permit said conductive gel to flow in an opposite sense to disconnect the said contacts of the component in circuit.

8. An electrical connector for use in interconnecting contacts normally spaced apart including:
   a structure of relatively firm insulating material having a given interior volume and having wall portions which displace upon compression of said structure, said structure including apertures aligned with the contacts to be interconnected;
   a non-conductive gel substantially filling the said volume; and
   a conductive gel positioned in said structure proximate to said apertures, the volume of the said gels being controlled to provide a hydraulic displacement of the non-conductive gel upon compression of the structure to hydraulically drive the said conductive gel to flow through said apertures and engage said contacts to effect an electrical interconnection therebetween.

9. The connector of claim 8 wherein the said structure is formed of sheets of material with the apertures defined in patterned arrays of a planar configuration with at least one of said gels having been coated upon at least one of said sheets of material.

10. The connector of claim 8 wherein the said structure is formed of sheets of material with the said gels having been applied thereto.

* * * * *